United States Patent [19]

Davis

[11] Patent Number: 4,517,524
[45] Date of Patent: May 14, 1985

[54] HIGH FREQUENCY OPERATIONAL AMPLIFIER

[75] Inventor: William F. Davis, Tempe, Ariz.
[73] Assignee: Motorola, Inc., Schaumburg, Ill.
[21] Appl. No.: 510,015
[22] Filed: Jul. 1, 1983
[51] Int. Cl.³ .............................................. H03F 3/45
[52] U.S. Cl. ..................................... 330/257; 330/151
[58] Field of Search ................. 330/252, 257, 307, 151

[56] References Cited

U.S. PATENT DOCUMENTS 3,538,449  11/1970  Solomon ............................ 330/261

OTHER PUBLICATIONS

Dobkin, "Feedforward Compensation Speeds Op Amp", *Electronics*, vol. 42, No. 10, May 12, 1969, pp. 61, 62.
*Electronic Design*, vol. 21, No. 4, Feb. 15, 1973, p. A9.

*Primary Examiner*—James B. Mullins
*Attorney, Agent, or Firm*—Vincent B. Ingrassia

[57] ABSTRACT

An operational amplifier includes a differential input stage and a composite differential amplifier second stage. The second stage includes first and second NPN transistors which receive at their base terminals the differential output of the first stage. The emitters of these transistors are coupled respectively to the base electrodes of first and second PNP transistors which act, in conjunction with a current mirror circuit, to produce a single ended output which is applied to the operational amplifiers output stage. A first capacitor is coupled between the base electrode of the first NPN transistor and the emitter electrode of the second PNP transistor while a second capacitor is coupled between the base electrode of the second NPN transistor and the emitter electrode of the first PNP transistor. These capacitors serve to speed the high frequency performance of the differential second stage and therefore the entire operational amplifier.

10 Claims, 1 Drawing Figure

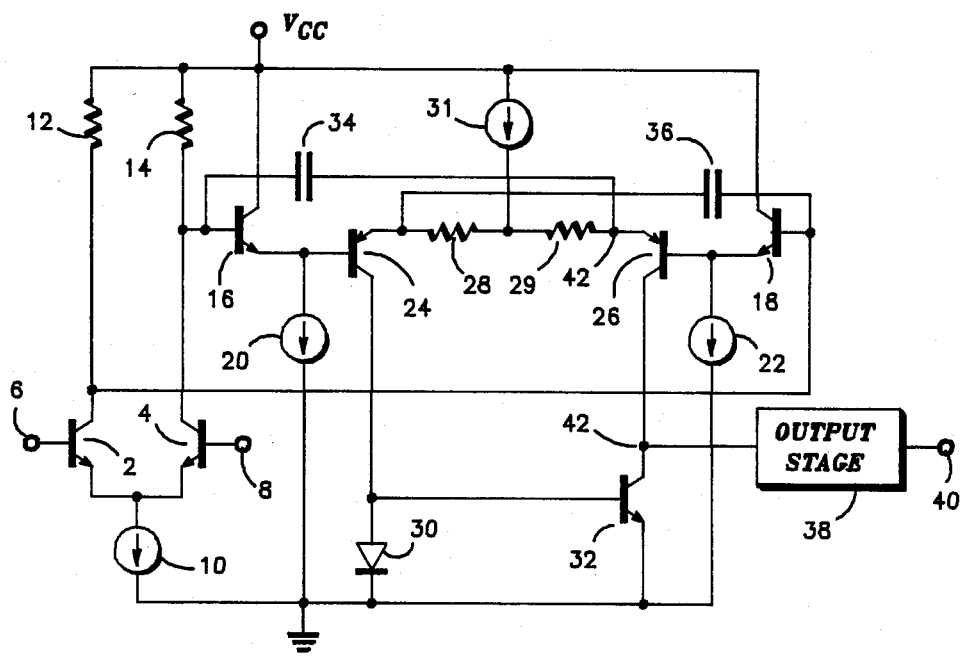

HIGH FREQUENCY OPERATIONAL AMPLIFIER

BACKGROUND OF THE INVENTION

This invention relates generally to amplifiers and, more particularly, to a low noise, high frequency operational amplifier.

Prior art low noise operational amplifiers such as the OP-27 manufactured by Precision Monolithics, Inc. utilize an NPN differential input stage including load resistors as the collector load impedances. These load resistors are chosen to be large so as to provide a high gain input stage and reduce offset voltage and noise. That is, the offset voltage and noise associated with the second stage is divided by the gain of the first stage.

The OP-27 operational amplifier also represents an attempt to achieve high frequency performance. While the device exhibits satisfactory phase margin (i.e. excess phase at unity gain), the gain characteristic of the device is such that after it passes down through the unity gain frequency, the gain rises again at a higher frequency. If the device has gain at the point where the phase approaches zero, the circuit will oscillate. This tendency to oscillate at higher frequencies in the unity gain configuration renders the frequency response of the device undesirable.

One problem faced by designers of operational amplifiers is that it is generally necessary to provide level shifting circuitry between the amplifier's input and output. When using an NPN input stage as above described, lateral PNP transistors are generally utilized to accomplish the level shift if the resulting operational amplifier is to have large dynamic supply voltage range. Unfortunately, lateral PNP transistors do not exhibit a very satisfactory behavior as a function of frequency. In the case of the OP-27 operational amplifier, several capacitive compensation circuits are employed to improve the frequency performance. Typically, as much as 370 pf of capacitance are used which occupies a great deal of space on a semiconductor die.

SUMMARY OF THE INVENTION

It is an object of the present invention to provide an improved operational amplifier.

It is a further object of the present invention to provide a low noise, high frequency operational amplifier wherein the amount of capacitance required for high frequency performance is substantially reduced.

It is a still further object of the present invention to provide a low noise, high frequency operational amplifier in which a high frequency gain has been eliminated from the gain characteristic.

According to a broad aspect of the invention there is provided a differential amplifier, comprising: first and second input means responsive to first and second input signals; first and second switching means coupled to said first and second input means respectively and responsive thereto; current mirror means coupled to said first and second switching means and cooperating therewith to provide an output signal; first capacitive transfer means coupled between the input of said first input means and said second switching means for transferring signal to said second switching means to speed the operation thereof; and second capacitive transfer means coupled between the input of said second input means and said first switching means for transferring signal to said first switching means to speed the operation thereof.

According to a further aspect of the invention there is provided an operational amplifier, comprising: a differential input stage for receiving first and second input signals and for generating first and second output signals; and a differential second stage for receiving said output signals and generating therefrom an output, said differential second stage comprising: first and second input means responsive to first and second output signals; first and second switching means coupled to said first and second input means respectively and responsive thereto; current mirror means coupled to said first and second switching means and cooperating therewith to provide said output; first capacitive transfer means coupled between the input of said first input means and said second switching means for transferring signal to said second switching means to speed the operation thereof; and second capacitive transfer means coupled between the input of said second input means and said first switching means for transferring signal to said first switching means to speed the operation thereof.

BRIEF DESCRIPTION OF THE DRAWINGS

The above and other objects, features and advantages of the present invention will be better understood from the following detailed description taken in conjunction with the accompanying drawing which is schematic diagram of the inventive operational amplifier.

DESCRIPTION OF THE PREFERRED EMBODIMENT

The inventive operational amplifier illustrated in the drawing includes an input stage which comprises first and second NPN transistors 2 and 4 having base electrodes coupled to differential input terminals 6 and 8 respectively, emitter electrodes coupled to ground via current source 10, and collector electrodes coupled via load resistors 12 and 14 (each having a resistance $R_L$) to a source of supply voltage $V_{CC}$.

The second stage of the operational amplifier is a differential amplifier and includes third and fourth NPN transistors 16 and 18 (input transistors) each having a collector coupled to $V_{CC}$ and each having an emitter coupled to ground via current sources 20 and 22 respectively, first and second PNP switching transistors 24 and 26 having their emitters coupled together via resistors 28 and 29 each having a value $R_E$ and each coupled to $V_{CC}$ via current source 31, a current mirror circuit including diode 30 and a fifth NPN transistor 32, and first and second capacitors 34 and 36. The base of transistor 16 is coupled to the collector of transistor 4 and a first terminal of capacitor 34 while the base of transistor 18 is coupled to the collector of transistor 2 and to a first terminal of capacitor 36. The second terminals of capacitors 34 and 36 are coupled to the emitters of PNP transistors 26 and 24 respectively. The collector of transistor 24 is coupled to the anode of diode 30 and to the base of transistor 32, and the collector of transistor 32 is coupled to the collector of transistor 26. Both the cathode of diode 30 and the emitter of transistor 32 are coupled to ground.

As is well known, an operational amplifier includes an output stage coupled to the output of the second stage. Box 38 represents such an output stage and has an input coupled to the collector of transistor 32 and an output coupled to terminal 40. An example of a suitable output stage is shown and described in copending patent application Ser. No. 295,880 filed on Aug. 24, 1981, now Pat. No. 4,403,200, and entitled OUTPUT STAGE FOR OPERATIONAL AMPLIFIER. This output stage includes first, second and third NPN output transistors, the first of which sources load current to an output terminal while the second and third transistors sink load current from the output terminal. A diode is coupled across the collectors of the second and third output transistors to conduct possible short circuit currents. Additionally, a pair of series coupled resistors are coupled across the collectors of the second and third output transistors. Output stage 38 would also include means for providing the well known Miller compensation.

The circuit operates as follows. When the voltage at input terminals 6 and 8 go high and low respectively, transistors 2 and 4 turn on and off respectively. Thus, the voltage at the base of transistor 16 will go high and the voltage at the base of transistor 18 will go low. Conversely, if the voltages at input terminals 6 and 8 are low and high respectively, transistor 2 will turn off and transistor 4 will turn on. This produces a low voltage at the base of transistor 16 and a high voltage at the base of transistor 18.

It is desired that a high voltage at the base of input transistor 16 and a low voltage at the base of input transistor 18 produce a high voltage at node 42 (the input of the output stage). Conversely, when the base voltage of transistor 16 is low and the base voltage of transistor 18 is high, a low voltage is desired at node 42. This is accomplished as follows. Ignoring for the moment the effect of capacitors 34 and 36, a high voltage at the base of transistor 16 and a low voltage at the base of transistor 18 causes transistor 26 to turn on and transistor 24 to turn off. Transistor 16 is biased by current source 20 to insure that transistor 24 remains off. Current source 22 sinks base current from PNP switching transistor 26 turning it on and biases transistor 18. As a result of the current mirror action, the voltage at node 42 goes high. When the voltage at the base of transistor 16 goes low and the voltage at the base of transistor 18 goes high, transistor 26 will turn off which results in current source 20 sinking base current from PNP transistor 24 turning it on. Current source 22 sinks the current from transistor 18 maintaining PNP transistor 26 off. Transistor 32 in the current mirror circuit will then sink current from node 42 causing the voltage at the input of output stage 38 to go low.

As should be appreciated, there is a significant delay between the time when the voltage at the base of transistor 16 or 18 switches to the time when the collector of its associated PNP transistor switches due to the poor frequency response of PNP transistors. This significantly reduces the frequency performance of the overall amplifier. To improve the speed of the second stage differential amplifier and therefore the frequency performance characteristics of the overall operational amplifier, capacitors 34 and 36 are coupled as shown. Capacitors 34 and 36 feed signal from the base of transistors 16 and 18 respectively to the emitters of transistors 26 and 24 respectively. This results in a much more rapid response to changes in voltage at the bases of transistors 16 and 18. For example, when the base of transistor 16 goes high, a high voltage is fed through capacitor 34 to the emitter of transistor 26 causing node 42 to increase in voltage prior to the time it would normally take transistor 26 to turn completely on without capacitor 34. At the same time, the low voltage at the base of transistor 18 is fed through capacitor 36 to the emitter of transistor 24 causing transistor 24 to begin turning off prior to the time it would normally take transistor 24 to turn completely off in response to the high voltage at its base.

Assuming that the value of load resistors 12 and 14 is $R_L$, the value of resistors 28 and 29 is $R_E$ and the capacitance of capacitors 34 and 36 is C, it can be shown that a system zero is created at $1/R_E C$ and a system pole is created at $\frac{1}{2} R_L C$. If $R_E$ is chosen to be equivalent to $2R_L$, the pole cancels the zero and an almost perfect transfer function results. In practice, $R_L$ may be 20K ohms and $R_E$ 40K ohms. Furthermore, capacitors 34 and 36 may be as small as 20 picofarads each. If we add to this, the capacitance in the output stage (typically 20–30 picofarads), the sum is still significantly smaller than the total capacitance in the prior art circuit. Therefore, not only is the frequency performance of the resulting circuit significantly improved, but the amount of die space occupied by capacitors is substantially reduced.

The above description is given by way of example only. Changes in form and details may be made by one skilled in the art without departing from the scope of the invention as defined by the appended claims.

I claim:

1. A differential amplifier, comprising:
   first and second input means responsive to first and second input signals;
   first and second switching means coupled to said first and second input means respectively and responsive thereto;
   current mirror means coupled to said first and second switching means and cooperating therewith to provide an output signal, said first and second switching means comprising: first and second transistors each having a base electrode coupled to said first and second input means respectively, a collector electrode coupled to said current mirror means and each having an emitter; impedance means coupled between the emitters of said first and second transistors; and a first current source coupled to the emitters of said first and second transistors for supplying current thereto;
   first capacitive transfer means coupled between the input of said first input means and the emitter of said second transistor for transferring signal to said second switching means to speed the operation thereof; and
   second capacitive transfer means coupled between the input of said second input means and the emitter of said first transistor for transferring signal to said first switching means to speed the operation thereof.

2. A differential amplifier according to claim 1 wherein said first and second input means comprise third and fourth transistors respectively each having a collector adapted to be coupled to a first source of supply voltage, the base electrodes of said third and fourth transistors being coupled respectively to said first and second input signals, the emitter electrodes of said third and fourth transistors being coupled to the base electrodes of said first and second transistors respectively, each of said first and second input means further comprising second and third current sources respectively, each adapted to be coupled between a second source of supply voltage and the emitter electrodes of said third and fourth transistors respectively.

3. A differential amplifier according to claim 2 wherein said first capacitive transfer means comprises a first capacitor coupled between the base of said third transistor and the emitter of said second transistor.

4. a differential amplifier according to claim 3 wherein said second capacitive transfer means comprises a second capacitor coupled between the base of said fourth transistor and the emitter of said first transistor.

5. A differential amplifier according to claim 4 wherein said first and second transistors are PNP transistors and said third and fourth transistors are NPN transistors.

6. An operational amplifier, comprising:
a differential input stage for receiving first and second input signals and for generating first and second output signals; and
a differential second stage for receiving said output signals and generating therefrom an output, said differential second stage comprising:
first and second inputs means responsive to first and second output signals;
first and second switching means coupled to said first and second input means respectively and responsive thereto;
current mirror means coupled to said first and second switching means and cooperating therewith to provide said output, said first and second switching means comprising: first and second transistors each having a base electrode coupled to said first and second input means respectively, a collector electrode coupled to said current mirror means and each having an emitter; and impedance means coupled between the emitters of said first and second transistors;
first capacitive transfer means coupled between the input of said first input means and the emitter of said second transistor for transferring signal to said second switching means to speed the operation thereof; and
second capacitive transfer means coupled between the input of said second input means and the emitter of said first transistor for transferring signal to said first switching means to speed the operation thereof.

7. An operational amplifier according to claim 7 wherein said first and second input means comprise:
third and fourth transistors respectively each having a collector adapted to be coupled to a first source of supply voltage, the base electrodes of said third and fourth transistors being coupled respectively to said first and second differential output signals, emitter electrodes of said third and fourth transistors being coupled to the base electrodes of said first and second transistors respectively, each of said first and second input means further comprising first and second current sources respectively each adapted to be coupled between a second source of supply voltage and the emitter electrodes of said third and fourth transistors respectively.

8. An operational amplifier according to claim 7 wherein said first capacitive transfer means comprises a first capacitor coupled between the base of said third transistor and the emitter of said second transistor.

9. An operational amplifier according to claim 8 wherein said second capacitive transfer means comprises a second capacitor coupled between the base of said fourth transistor and the emitter of said first transistor.

10. An operational amplifier according to claim 9 wherein said first and second transistors are PNP transistors and said third and fourth transistors are NPN transistors.

* * * * *